United States Patent
Tanabe (10) Patent No.: US 7,294,930 B2
(45) Date of Patent: Nov. 13, 2007

(54) SEMICONDUCTOR DEVICE AND MANUFACTURING PROCESS THEREFOR

(75) Inventor: Akihito Tanabe, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/342,527

(22) Filed: Jan. 31, 2006

(65) Prior Publication Data

US 2006/0186405 A1    Aug. 24, 2006

(30) Foreign Application Priority Data

Feb. 8, 2005    (JP) ............................... 2005-031999

(51) Int. Cl.
*H01L 23/48* (2006.01)

(52) U.S. Cl. ...................................... 257/737; 257/773

(58) Field of Classification Search ................ 257/737, 257/739, 773, 784, 786, 797; 324/754–758
See application file for complete search history.

(56) References Cited

U.S. PATENT DOCUMENTS

| | | | |
|---|---|---|---|
| 6,563,226 B2 * | 5/2003 | Harun et al. | 257/784 |
| 6,713,881 B2 | 3/2004 | Umehara et al. | |
| 6,784,556 B2 * | 8/2004 | Lin | 257/784 |
| 6,897,669 B2 * | 5/2005 | Ishio et al. | 324/757 |
| 2003/0197289 A1 | 10/2003 | Lin | |
| 2004/0069988 A1 | 4/2004 | Lin et al. | |

FOREIGN PATENT DOCUMENTS

JP    2001-338955    12/2001

* cited by examiner

*Primary Examiner*—Kevin M. Picardat
(74) *Attorney, Agent, or Firm*—Young & Thompson (57) ABSTRACT

An objective of this invention is to allow each process of contacting of a test probe and bonding to be reliably conducted within a given region. A semiconductor device 100 has a probing mark 111 forming region; a bonding pad 110 having a bonding region 113; and a check mark 120 separate from the bonding pad 110. In the configuration, the probing mark 111 forming region and the bonding region 113 can be identified on the basis of a planar shape of the check mark 120.

14 Claims, 9 Drawing Sheets

SEMICONDUCTOR DEVICE AND MANUFACTURING PROCESS THEREFOR

This application is based on Japanese patent application No. 2005-031999, the content of which is incorporated hereinto by reference.

BACKGROUND

1. Technical Field

The present invention relates to a semiconductor device having a bonding pad and a manufacturing process therefor.

2. Related Art

There have been described bonding techniques for a semiconductor device in Japanese Laid-open publication NO. 2001-338955, U.S. Pat. No. 6,713,881, United States Serial No. 2004/0069988 and United States Serial No. 2003/0197289.

Japanese Laid-open publication NO. 2001-338955 and U.S. Pat. No. 6,713,881 have described a bonding pad having a bonding region and a probe-contacting region in which the bonding region is wider than the probe-contacting region and in which notches are provided as a marker in both sides of the border between the bonding region and the probe-contacting region.

United States Serial No. 2004/0069988 has described a bonding pad where protrusions are provided in both sides of a border between a bonding region and a probe-contacting region. United States Serial No. 2003/0197289 has described a bonding pad provided with, for example, such a protrusion.

SUMMARY OF THE INVENTION

However, after investigating the techniques described in Japanese Laid-open publication NO. 2001-338955, U.S. Pat. No. 6,713,881, United States Serial No. 2004/0069988 and United States Serial No. 2003/0197289, we have found that there is room for improvement in terms of the following respects. In a device configuration where a metal layer to be a bonding pad is exposed from an opening of a passivation layer formed on a semiconductor substrate as described in Japanese Laid-open publication NO. 2001-338955, U.S. Pat. No. 6,713,881, United States Serial No. 2004/0069988 and United States Serial No. 2003/0197289, forming a notch or protrusion indicating a border between a bonding region and a probe-contacting region in the bonding pad requires to microfabricate the passivation layer into a shape corresponding to the notch or the protrusion.

However, as miniaturization of a binding pad has proceeded, it has become difficult to form a polyimide layer generally used as a passivation layer into a planar shape having such fine irregularity. Therefore, when a semiconductor device is practically manufactured, it is difficult to limit probe contact to the outside of a bonding region, which may lead to a probe mark due to probe contact within the bonding region. The probe mark within the bonding region may cause peeling during bonding, lead to reduction in a production yield.

According to an aspect of the present invention, there is provided a semiconductor device, comprising:

a bonding pad including a bonding region and a test-probe-contacting region within one pad; and an area identification mark separate from the bonding pad such that it indicates a border between the bonding region and the test-probe-contacting region.

In the semiconductor device according to the present invention, the area identification mark is separate from the bonding pad, so that the area identification mark can be provided as a region independent of the bonding pad. Therefore, even when a bonding pad is micronized or there are limitations to shaping of the bonding pad, an area identification mark with a given size and a given shape can be stably provided.

Furthermore, in the semiconductor device according to the present invention, the area identification mark is provided such that is indicates a border between the bonding region and the test-probe-contacting region. Therefore, the border between the bonding region and the test-probe-contacting region can be readily and reliably detected. Thus, when contacting a test probe with the area within the bonding pad, it can be reliably guided within the test-probe-contacting region, preventing probe contact from causing a probe mark in the bonding region. As a result, it can prevent bonding peeling due to bonding in the probe marked region, resulting in improvement in production stability.

According to another aspect of the present invention, there is provided a process for manufacturing a semiconductor device, comprising:

preparing the aforementioned semiconductor device;

detecting the border by means of the area identification mark and contacting a test probe with the test-probe-contacting region on the basis of the detected border;

bonding a conductor for external connection to the bonding region on the basis of the detected border after the contacting the test probe.

In the manufacturing process, the border is detected using the area identification mark, and a test probe is contacted to the probe-contacting region on the basis of the detected border. A probe mark due to probe contact can be reliably limited within the probe-contacting region. Furthermore, the conductor for external connection is bound in the bonding region on the basis of the detected border, so that bonding can be reliably limited within a given region. It can, therefore, lead to prevention of bond peeling due to overlap of the region involved in bonding with a probe mark formed by contact of the test probe. As a result, a production yield can be improved in such a convenient manner.

In the specification, a "test-probe-contacting region" refers to a region with which a test probe is to be contacted, and a "bonding region" refers to a region to which a conducting member for external connection is to be bound.

According to the present invention, since an area identification mark separate from a bonding pad is provided such that it indicates a border between a bonding region and a test-probe-contacting region, a test probe contact and bonding can be stably within given regions, respectively.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

There will be described embodiments of this invention with reference to the drawings. In all of the figures, a common component is indicated by the same symbol, whose description is not represented as appropriate.

Embodiment 1

Figure 1:
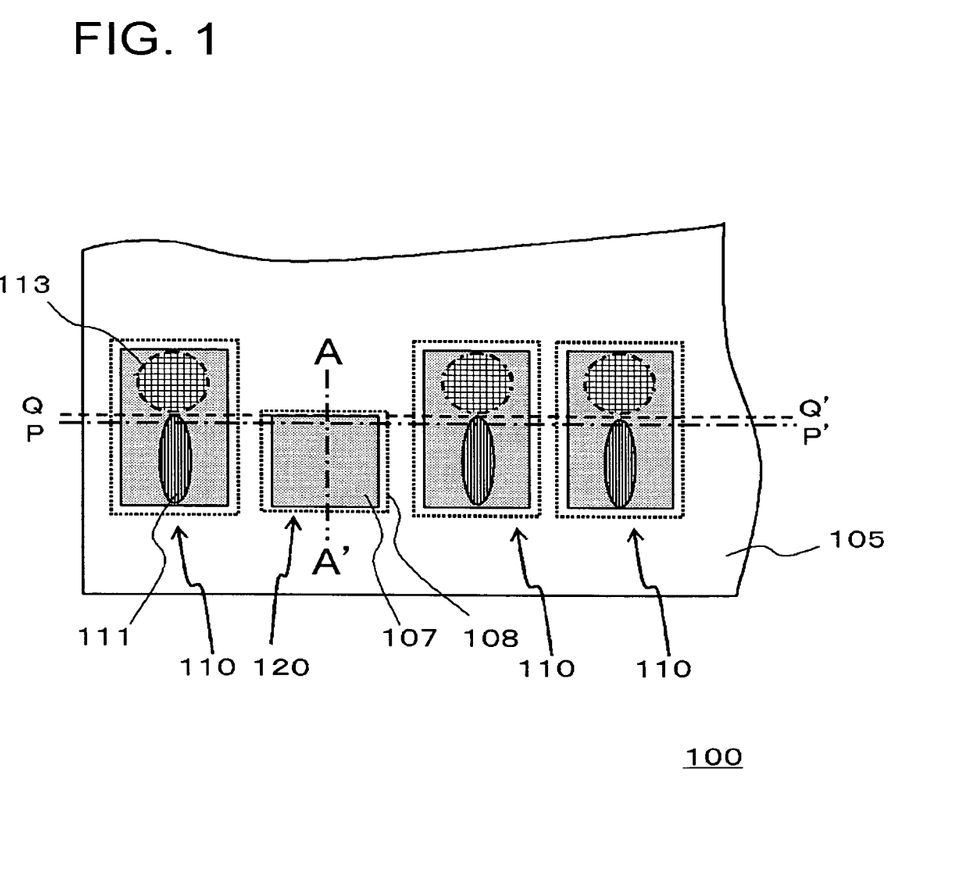
FIG. 1 is a plan view illustrating a configuration of a semiconductor device according to this embodiment.
Figure 2:
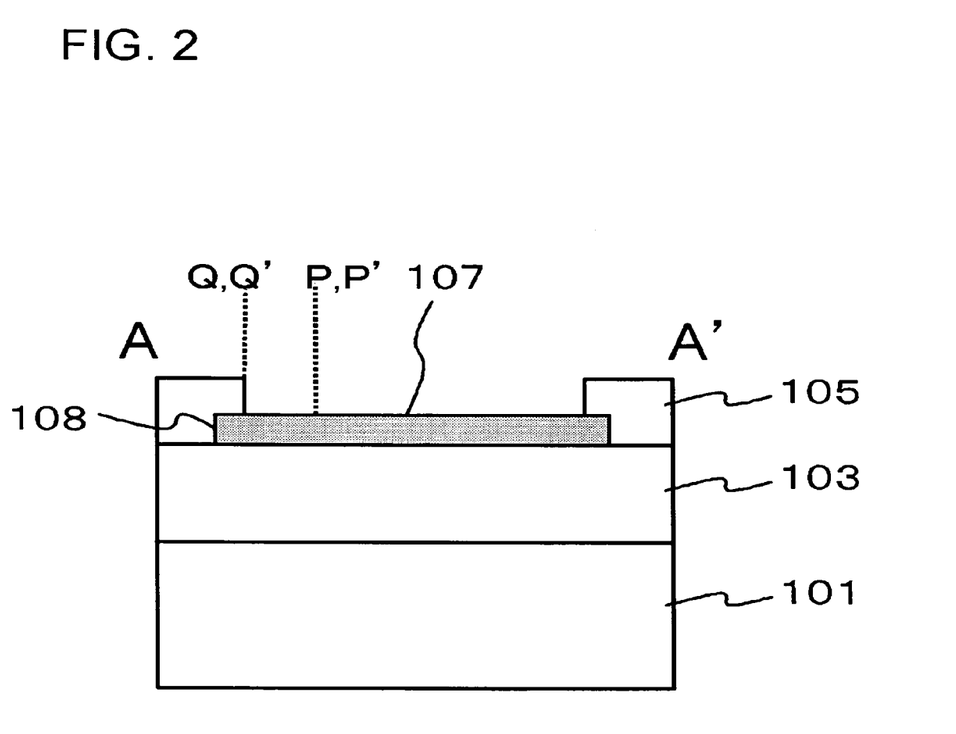
FIG. 2 is a cross-sectional view taken on line A-A' of FIG. 1.

FIG. 1 is a plan view illustrating a configuration of a semiconductor device according to this embodiment. Line P-P' in FIG. 1 is a midline of longer sides in a rectangular bonding pad 110 while line Q-Q' is a border between a probing mark 111 forming region and a bonding region 113. FIG. 2 is a cross-sectional view taken on line A-A' of FIG. 1.

A semiconductor device 100 shown in FIG. 1 has the bonding pad 110 having the bonding region 113 and a test-probe-contacting region (the probing mark 111 forming region) in one pad, and an area identification mark (check mark 120) separate from the bonding pad 110, which is configured to indicate the border (Q-Q') between the bonding region 113 and the probing mark 111 forming region. The check mark 120 is, for example, a visually identifiable region in an element forming surface in the semiconductor device 100.

The semiconductor device 100 has such a structure that a border can be detected on the basis of the contour of the region occupied by the check mark 120. For example, in the semiconductor device 100, the border may be an extension of a tangent line at a given position on the contour of the check mark 120. When at least part of the contour is straight, the border may be an extension of the straight part.

In FIG. 1, the check mark 120 has a substantially rectangular planar shape, in which one side of the rectangle indicates a border. More specifically, the border is an extension of one side of the rectangle. In the specification, a substantially rectangle planar shape may be any rectangle in which at least one side has a straight region indicating a border; for example, the corners of the rectangle may be rounded off during a manufacturing process to give a rounded shape. The planar shape of the check mark 120 is not limited to a rectangle, but may be a trapezoid. Furthermore, the planar shape of the check mark 120 may be a polygon such as a triangle.

The width of the region occupied by the check mark 120 indicates the width of the bonding region 113 or the probing mark 111 forming region. Herein, a width of a region refers to a length between the ends of the region in a given direction. For example, when the check mark 120 has a rectangular planar shape, a distance between the facing sides in the rectangle may be the width of the region. Here, in the bonding pad 110, a distance of the extensions of the facing sides is the width of the bonding region 113 or the probing mark 111 forming region. In FIG. 1, a width of the region occupied by the check mark 120 is a width of the probing mark 111 forming region.

The semiconductor device 100 has a plurality of bonding pads 110 and one check mark 120 indicates a border of each of the plurality of bonding pads 110. More specifically, the semiconductor device 100 has a row in which a plurality of bonding pads 110 are linearly aligned, and at least one check mark 120 is provided for each row and one check mark 120 indicates the border of the bonding pads 110 constituting one row. In FIG. 1, the borders of all of the bonding pads 110 in the row is indicated by one check mark 120.

Furthermore, at least part of the contour of the check mark 120 is straight and the straight part is disposed in parallel with the extension direction of the row, and the border of the bonding pads 110 constituting one row is an extension of the straight part.

The bonding pad 110 and the check mark 120 are formed in the same level and are made of the same material. The bonding pad 110 and the check mark 120 are regions where a conductive material such as a metal is exposed from an element forming surface.

The semiconductor device 100 further has a semiconductor substrate (silicon substrate 101) and a protective layer (polyimide layer 105) made of an organic resin formed on the silicon substrate 101 in which an opening is formed in a given region, and the contour of the opening constitutes the contour of the check mark 120. The organic resin may be a polyimide or poly-para-phenylenebenzoxazole (PBO). Although the organic resin is as an example a polyimide in FIGS. 1 and 2, the organic resin may be PBO. In such a case, a PBO layer may be formed instead of the polyimide layer 105.

There will be more specifically described the configuration of the semiconductor device 100.

The semiconductor device 100 has the silicon substrate 101 (FIG. 2), the multilayer 103 formed on the silicon substrate 101 (FIG. 2), and the bonding pad 110 and the check mark 120 formed on the multilayer 103. The bonding pad 110 and the check mark 120 has a metal layer such as an Al layer and an opening of the polyimide layer 105 over the layer. The edge and its neighboring region of the Al layer forming region 108 are covered by the polyimide layer 105 while the region not covered by the polyimide layer 105 is an exposed Al-layer area 107. The bonding pad 110 and the check mark 120 are made of the same material in the same level, specifically in the same layer. These can be formed by one step. Furthermore, given numbers of the bonding pads 110 and the check marks 120 are independently disposed at predetermined positions on the multilayer 103.

The polyimide layer 105 acts as a passivation layer and covers the upper surface of the multilayer 103. The polyimide layer 105 has openings in regions where the bonding pad 110 and the check mark 120 are to be formed. The surfaces of the bonding pad 110 and the check mark 120 are exposed from the openings.

In a plan view, the contours of the openings in the polyimide layer 105 are the contours of the bonding pad 110 and the check mark 120. The planar shapes of the bonding pad 110 and the check mark 120 are rectangles, respectively. Particularly, FIG. 1 shows, as an example, a configuration where the check mark 120 has a square planar shape. One bonding pad 110 has a probe-contacting region as a region for forming the probing mark 111 and a bonding region 113 for bonding. The check mark 120 is disposed in a region other than the region for forming the bonding pad 110 separately from the bonding pad 110, and is responsible for area separation between the probing mark 111 and the bonding region 113.

In terms of a size of the check mark 120, for example, a length of one side in the rectangle may be 15 μm or more, preferably 20 μm or more. It may lead to further improvement in production stability of the check mark 120 and in visibility. There are no particular restrictions to the upper limit of a length of one side in the check mark 120, but a too large length may lead to a too large area of the region occupied by the check mark 120. Further considering this respect, a length of the short side of the rectangle may be, for example, 20 μm to 40 μm both inclusive. A length of the long side can be appropriately selected in accordance with the size of the pad.

The semiconductor device 100 has a plurality of bonding pads 110. The plurality of bonding pads 110 are aligned on a line along the edge of the silicon substrate 101 in a region near the edge of the silicon substrate 101 such that the centers of the long sides of the rectangle are disposed on the same line (line P-P' in FIG. 1). In terms of the border line (Q-Q') between the probing mark 111 forming region and the bonding region 113, the plurality of bonding pad 110 disposed in one row are also positioned on the same line.

Although there is illustrated a configuration where in the bonding pad 110, the width of the bonding region 113 (a length in a direction perpendicular to P-P') is smaller than the width of the width of the probing mark 111 forming region in FIG. 1, there are no particular restrictions to areal magnitude relation between the bonding region 113 and the probing mark 111 forming region.

Next, there will be described a process for manufacturing the semiconductor device 100.

The manufacturing process for the semiconductor device 100 has the steps of preparing the semiconductor device shown in FIGS. 1 and 2; detecting the border (Q-Q') by means of the check mark 120 and contacting a test probe with the probing mark 111 forming region on the basis of the detected border; and bonding a conductor for external connection to the bonding region 113 on the basis of the detected border after the step of contacting the test probe. The conductor for external connection is, for example, a conductor used for wire bonding connection.

More specifically, the semiconductor device 100 may be prepared by, for example, the following procedure, using a previously known process. First, on the silicon substrate 101 is formed a multilayer 103 on which an interconnection layer, an interlayer insulating layer and the like have been formed. Then, on the uppermost interlayer insulating layer is formed an Al layer. Subsequently, the Al layer is patterned into the shapes of the bonding pad 110 and the check mark 120. The shape of the Al layer is such that it is extended outward from the edges of the bonding pad 110 and the check mark 120 to a given extent.

Next, on the whole upper surface of the patterned Al layer is formed the polyimide layer 105 by an application method. Then, on the polyimide layer 105 is formed a mask pattern having a planar shape corresponding to the shapes of the bonding pad 110 and the check mark 120. The mask is used for selective removing the polyimide layer 105 in the regions for forming the bonding pad 110 and the check mark 120. Thus, in the polyimide layer 105, there are openings, from which the Al layer is exposed, that is, a part of the Al-layer forming region 108 becomes an exposed Al-layer area 107. After the above procedure, a semiconductor device having the bonding pad 110 and the check mark 120 is provided.

Next, a probe is contacted with the probe-contacting region in the bonding pad 110 to observe a probe mark. Here, the check mark 120 is used to define a probing mark 111 forming region for the probe. Specifically, the outer edge of the check mark 120, that is, an extension of one side of the rectangle (Q-Q' in FIG. 1) in this figure, corresponds to an end of the probe-contacting region, that is, a border between the probing mark 111 forming region and the bonding region 113. So, a probe is contacted with an inner surface of the end and then slided on the bonding pad 110. During the process, a probing mark 111 is formed on the exposed Al-layer area 107 within the probing mark 111 forming region. As described above, the semiconductor device 100 shown in FIG. 1 is provided.

Subsequently, when the probe mark after probing is observed, the check mark 120 is used for visual inspection's judgment. Specifically, product release is decided, based on whether or not the probing mark 111 is formed in the distal side to the border Q-Q' in FIG. 1 from the check mark 120. Then, a released product is bound to a conducting member for external connection in the bonding region 113 in the bonding pad 110. Again, the check mark 120 is used for detecting the border between the probing mark 111 forming region and the bonding region 113 to conduct bonding inside of the detected border. Specifically, a bonding wire is bound to the bonding region 113. Alternatively, the end of a bonding wire may be molten into a ball, which is then bound to the bonding region 113, and then the wire is drawn off to form a bump. A material for the conducting member for external connection is a metal such as Al, Au and Cu.

There will be described effects of the semiconductor device 100 (FIGS. 1 and 2).

In the semiconductor device 100 shown in FIGS. 1 and 2, the check mark 120 is separate from the bonding pad 110. Therefore, an empty space during forming the bonding pad 110 can be used for disposing the bonding pad 110.

The bonding pad 110 consists of the polyimide layer 105 and an Al layer exposed from an opening, and the contour of the check mark 120 forming region is identical to the contour of the opening in the polyimide layer 105. Thus, the configuration exhibits excellent visibility for the border between the probing mark 111 forming region and the bonding region 113. Thus, the probing mark 111 can be reliably formed within a given region, preventing it from being formed in the side of the bonding region 113. Therefore, it can prevent bond peeling due to overlapping of the bond with the probing mark 111 in the bonding region 113. As a result, defects during bonding can be inhibited, resulting in a higher production yield.

In the semiconductor device 100, one side of the rectangle which constitutes an end of the check mark 120 indicates the border between the probing mark 111 forming region and the bonding region 113, and the border is on an extension of one side of the rectangle. Thus, the position of the border can be further reliably detected. Furthermore, the width of the check mark 120 corresponds to the width of the probing mark 111 forming region. Therefore, in probing it can be readily determined which region in the bonding pad 110 is the probing mark 111 forming region, and the border can be highly visible. In this configuration, not only the border but also a region width are indicated, so that probe contacting or bonding can be further reliably conducted within a given region.

In the semiconductor device 100, in the bonding step, bonding can be effected in the side of the region where the check mark 120 is not to be formed, and as described above, the border is highly visible, so that in the course of the bonding, an operator can visually bind a conducting member within the border of the bonding region 113 in a reliable manner.

For the semiconductor device 100, a probing area is set by a prober on the basis of detection results of the border and the width of the probing mark 111 forming region using the check mark 120, and furthermore, in determining a probe mark after probing, visual inspection's judgment is effected with reference to the check mark 120. In the bonding step, the border is also detected with reference to the check mark 120. Thus, the positions of the probing and the bonding are reliably detected and these steps can be reliably in a given region within the border. It can facilitate determining whether probing has been conducted in the given probing mark 111 forming region and thus visual inspection's judgment for a probing position by an operator. Therefore, chip defects can be reliably prevented and controlled by visual inspection, so that apparent defects can be visually detected in the step of wafer inspection in a manufacturing process for the semiconductor device 100.

In a device described in Japanese Laid-open publication NO. 2001-338955, U.S. Pat. No. 6,713,881, United States Serial No. 2004/0069988 and United States Serial No. 2003/0197289 which has been described in "Related Art", a mark such as a protrusion is provided in a bonding pad. It is, therefore, necessary to form a mark (a pair of marks) for one bonding pad. Furthermore, since one mark provides information on a border position in only one bonding pad, it is necessary to form protrusions for all bonding pads. In addition, as described above, when practically attempting to form a protrusion, it may be difficult to conduct adequately fine processing to identify a border between a bonding region and a probe region. For example, according to our investigation, when a thickness of the polyimide layer 105 is about 5 μm to 6 μm, the polyimide layer 105 may fall if its width is less than 13 μm.

In contrast, in the semiconductor device 100, the check mark 120 is formed separately from the bonding pad 110 and the check mark 120 is a region occupying a given area, to eliminate the necessity for fine processing required in Japanese Laid-open publication NO. 2001-338955, U.S. Pat. No. 6,713,881, United States Serial No. 2004/0069988 and United States Serial No. 2003/0197289. Thus, the check mark 120 can be reliably formed, resulting in higher production stability. Furthermore, forming the check mark 120 separately from the bonding pad 110 allows given numbers of the bonding pad 110 and check mark 120 to be disposed at predetermined positions, and freedom in planar configuration can be improved. The semiconductor device 100 has a plurality of bonding pads 110, and one check mark 120 indicates a border for each of the plurality of bonding pads 110. Thus, by forming one check mark 120 for the plurality of bonding pads 110, the whole device configuration can be simplified.

Furthermore, in the semiconductor device 100, the bonding pad 110 and the check mark 120 are formed in the same level and made of the same material, so that the bonding pad 110 and the check mark 120 can be formed in one step, resulting in a simplified production process.

Although FIG. 1 illustrates a configuration where three bonding pads 110 are aligned on a straight line and one check mark 120 is provided between two adjacent bonding pads 110, the numbers and the positions of the bonding pad 110 and the check mark 120 are not limited to those in the figure as long as the contour of the check mark 120, that is, its outer edge, is disposed such that it indicates the positions of the end of the probing mark 111 forming region or the bonding region 113 of the bonding pad 110 in the row.

Figure 3:
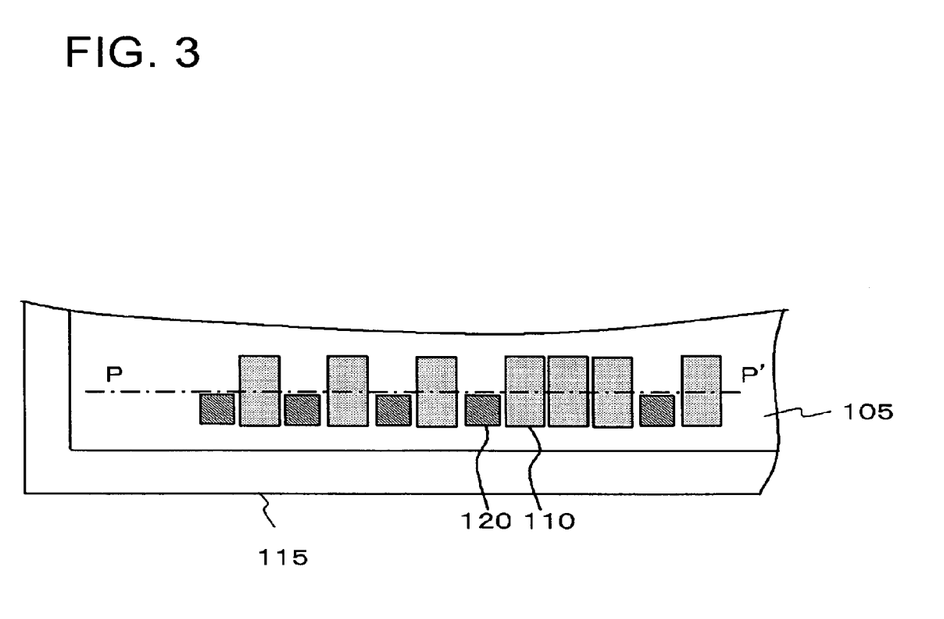
FIGS. 3 to 9 are plan views illustrating a configuration of a semiconductor device according to this embodiment.
Figure 4:
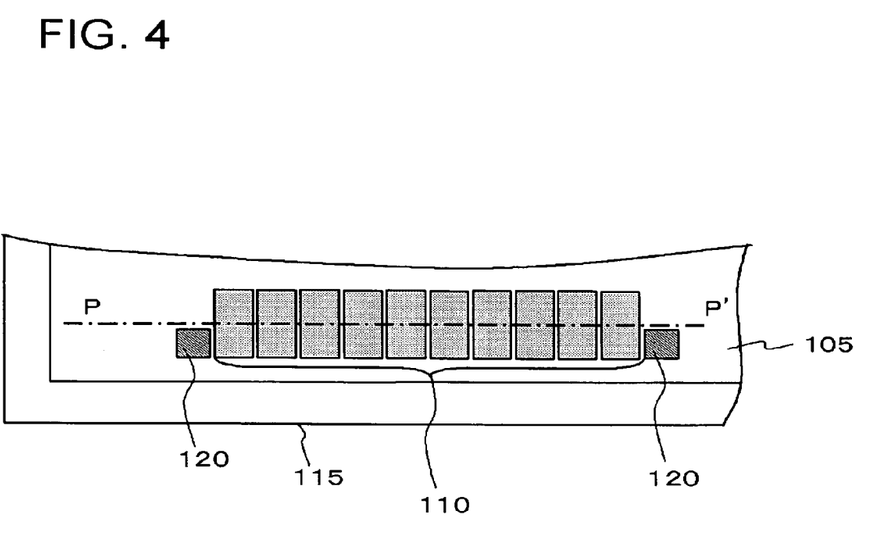

FIGS. 3 and 4 schematically show other examples of a planar arrangement of the bonding pad 110 and the check mark 120.

In FIG. 3, a plurality of bonding pads 110 are disposed in a straight line at predetermined positions near a scribe center 115, and check marks 120 are provided in areas having an adequate space between adjacent bonding pads 110. Thus, by forming the check mark 120 separately from the bonding pad 110, the check mark 120 can be disposed in a space region where a bonding pad 110 is not to be provided. A space on a silicon substrate 101 can be, therefore, efficiently used.

FIG. 4 shows an example where there is disposed one check mark 120 outside of each of the bonding pads 110 disposed at both ends among a row of the bonding pads 110. At least one check mark 120 can be provided to a row of the bonding pads 110 in a region where the bonding pad 110 is not to be formed, but as shown in FIG. 4, a pair of check marks 120 may be disposed at both ends of the row of the bonding pads 110. Thus, prober scan can be conducted from the side of one check mark 120 to the other check mark 120, at which the presence of misalignment during the prober scan can be detected. When misalignment is detected, the check mark 120 can be used to correct the prober position. Thus, alignment precision for a prober can be further improved.

The semiconductor device 100 illustrated has the bonding pad 110 having a planar shape corresponding to the probing mark 111 forming region, which is disposed between two adjacent probing mark 111 forming regions for indicating the width of the probing mark 111 forming region, but it may have a configuration where the bonding pad 110 indicates the width of the bonding region 113.

Figure 5:
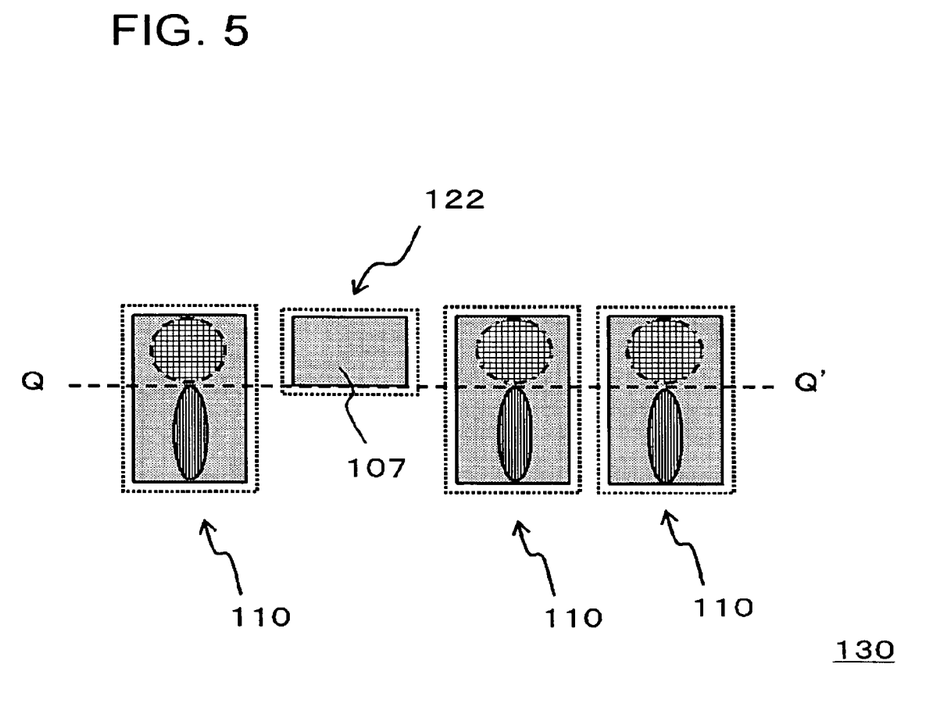

FIG. 5 is a plan view illustrating a configuration of such a semiconductor device. In the semiconductor devices shown in FIG. 5 and FIGS. 6 to 9, the silicon substrate 101 and the multilayer 103 are not shown.

A semiconductor device 130 shown in FIG. 5 has a check mark 122 in place of the check mark 120 shown in FIG. 1. The check mark 122 has the basic configuration as described for the check mark 120 shown in FIG. 1, except that it has a planar shape corresponding to the planar shape of the bonding region 113. Furthermore, in FIG. 5, a check mark 122 is disposed between two adjacent bonding regions 113, and of the outer edge of the check mark 122, one side of the rectangle indicates the end of the bonding region 113 (Q-Q' in FIG. 5) while the width of the check mark 122 indicates the width of the bonding region 113. The semiconductor device 130 in FIG. 5 is as effective as the semiconductor device 100 in FIG. 1.

In the following embodiment, there will be mainly described differences from Embodiment 1.

Embodiment 2

In terms of the semiconductor device of Embodiment 1 (FIGS. 1 to 5), there has been described a configuration where one check mark is a mark for one border of the row of bonding pads 110, but one check mark may indicate a plurality of borders.

Figure 6:
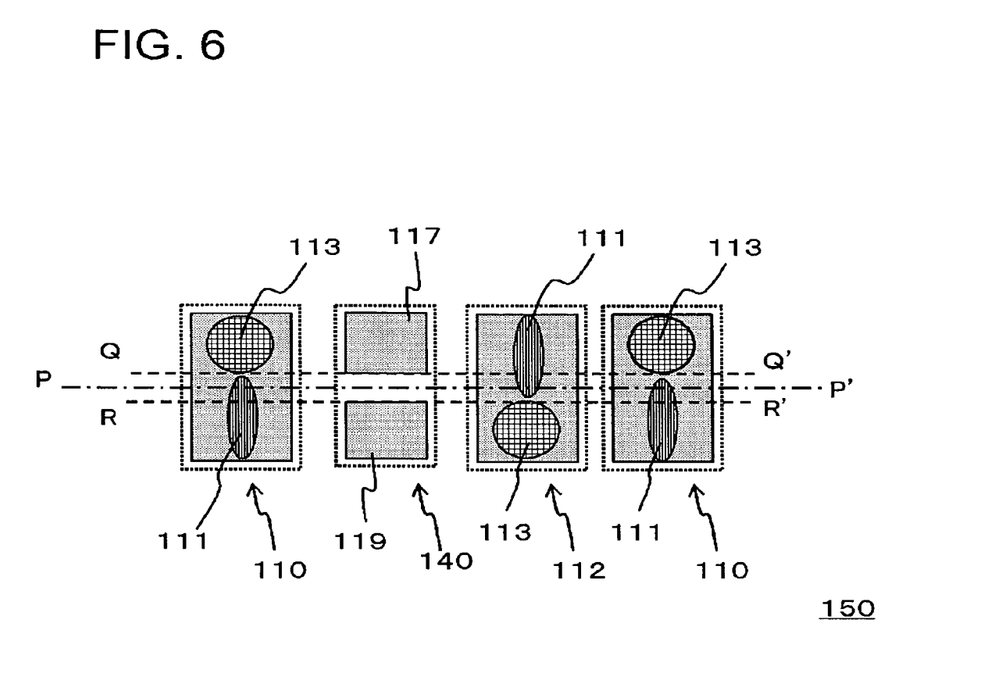

FIG. 6 is a plan view illustrating a configuration of a semiconductor device according to this embodiment.

A semiconductor device 150 shown in FIG. 6 has a configuration where bonding regions 113 and probing mark 111 forming regions are alternately aligned along an extension of the row of the bonding pads, and one check mark 140 indicates the border (Q-Q') of one bonding pad 110 constituting the row and the border (R-R') of another bonding pad 112 adjacent to one bonding pad.

In the semiconductor device 150 shown in FIG. 6, the bonding pads 110 and the bonding pads 112 are alternately aligned on the same straight line (P-P'). Although the bonding pad 110 and the bonding pad 112 have the same planar shape, the bonding pad 112 has a configuration where in relation to the center line P-P', the probing mark 111 forming region and the bonding region 113 forming region are formed in the opposite side to the bonding pad 110. In other words, the bonding regions 113 are arranged in a zigzag or staggered manner in relation to the center line P-P'.

In such a configuration, the check mark 140 must indicate, in addition to the border between the probing mark 111 forming region and the bonding region 113 in the bonding pad 110, the border between the probing mark 111 forming region and the bonding region 113 in the bonding pad 112. A conventional mark does not have such a configuration, so that attempting to zigzag probing may cause formation of a probing mark 111 in the side of the bonding region 113 in either the bonding pad 110 or the bonding pad 112.

Thus, the semiconductor device 150 has a configuration where one check mark 140 is provided with a first exposed Al-layer area 117 and a second exposed Al-layer area 119. Both first exposed Al-layer area 117 and second exposed Al-layer area 119 have a rectangular planar shape, which is identical to the shape of the exposed Al-layer area 107 in the check mark 120 in the semiconductor device 100 shown in FIG. 1.

By forming a planar check mark 140 where two exposed Al-layer areas are disposed in both sides of the center line P-P', respectively, the border Q-Q' between the probing mark 111 forming region and the bonding region 113 in the bonding pad 110 can be identified by means of one side of the first exposed Al-layer area 117 and furthermore, the border R-R' between the probing mark 111 forming region and the bonding region 113 in the bonding pad 112 adjacent to the bonding pad 110 can be identified by means of one side of the second exposed Al-layer area 119. Therefore, even in zigzag probing in relation to the center line P-P', formation of a probing mark 111 within the bonding region 113 can be prevented, resulting in improvement in production stability. Furthermore, since the check mark 140 is also separate from the bonding pad 110 and the bonding pad 112 as in, for example, the check mark 120 shown in FIG. 1, this embodiment is as effective as Embodiment 1.

In the semiconductor device 150, one exposed Al-layer area corresponds to one border, so that in comparison with a configuration described later with reference to FIG. 7, a region for forming an opening in the polyimide layer 105 can be more adequately ensured. Therefore, an opening can be more reliably formed in the polyimide layer 105.

In the semiconductor device 150, the first exposed Al-layer area 117 and the second exposed Al-layer area 119 can be formed in the whole check mark 140 forming region in the longitudinal (P-P') direction, so that the border between the probing mark 111 forming region and the bonding region 113 can be more easily detected in comparison with the configuration described later with reference to FIGS. 8 and 9.

Although there has been described a configuration where two exposed Al-layer areas are formed in one bonding pad in FIG. 6, one exposed Al-layer region in one bonding pad may indicate a plurality of borders of bonding pads 110. FIGS. 7 and 9 are plan views illustrating a configuration of such a semiconductor device.

Figure 7:
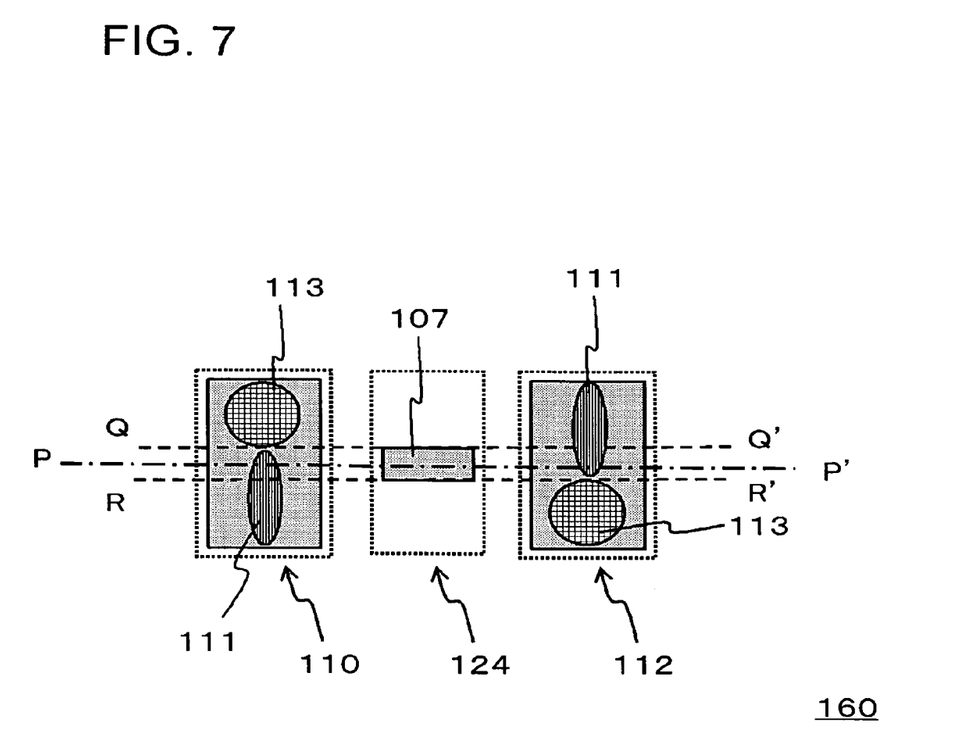

In a semiconductor device 160 shown in FIG. 7, a check mark 124 has a rectangular planar shape, and one side of the check mark 124 is on a border Q-Q' while another side is on a border R-R'. Two opposite sides in the check mark 124 indicate the borders Q-Q' and R-R' which can be identified, so that the device is as effective as the semiconductor device 150 shown in FIG. 6. Furthermore, the check mark 124 may have a simpler configuration than the semiconductor device 150.

Although FIG. 6 illustrates the configuration where the first exposed Al-layer area 117 and the second exposed Al-layer area 119 are aligned on the straight line perpendicular to the center line P-P', the first exposed Al-layer area 117 and the second exposed Al-layer area 119 may be disposed obliquely to the straight line perpendicular to the center line P-P'.

Figure 8:
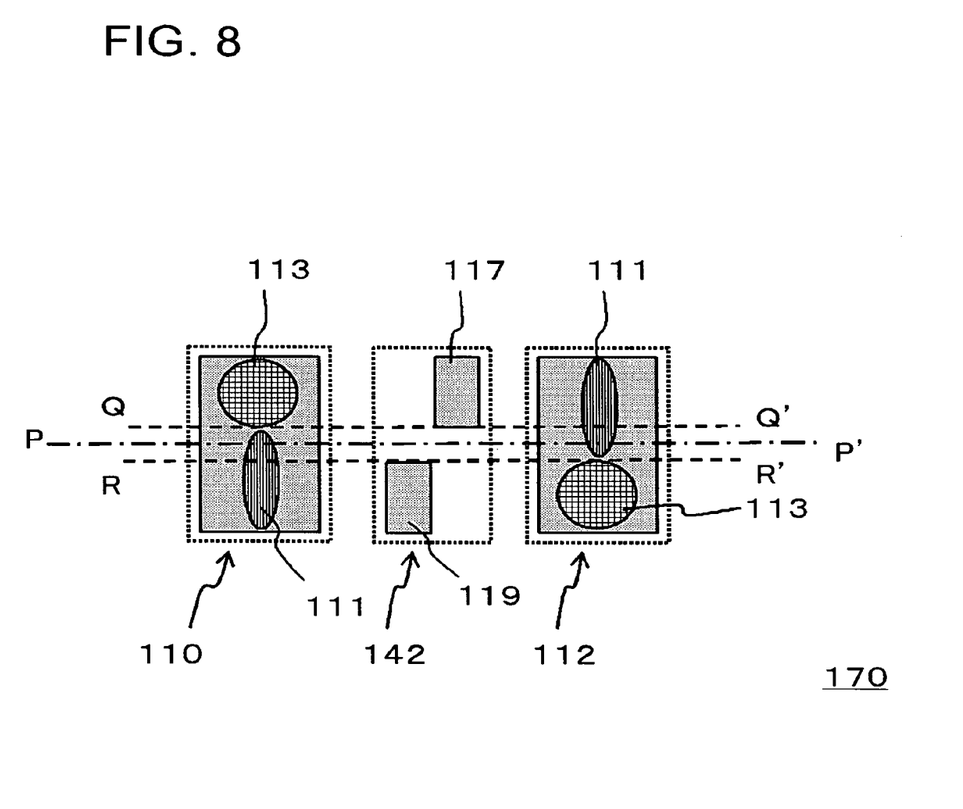

FIG. 8 is a plan view illustrating a configuration of a semiconductor device having such a bonding pad. The semiconductor device 170 shown in FIG. 8 has a basic configuration as in the semiconductor device 150 shown in FIG. 6, except that the first exposed Al-layer area 117 and the second exposed Al-layer area 119 are obliquely disposed in the check mark 142. In this configuration, a minimum distance between the ends of the first exposed Al-layer area 117 and of the second exposed Al-layer area 119 is larger than that in the check mark 140 in the semiconductor device 150 of FIG. 6. An opening can be, therefore, more reliably formed in the polyimide layer 105.

Also, in the configuration employing one check mark described above with reference to FIG. 7, the straight region indicating the border Q-Q' can be disposed obliquely to the straight region indicating the border R-R'. FIG. 9 is a plan view illustrating a configuration of such a semiconductor device.

Figure 9:
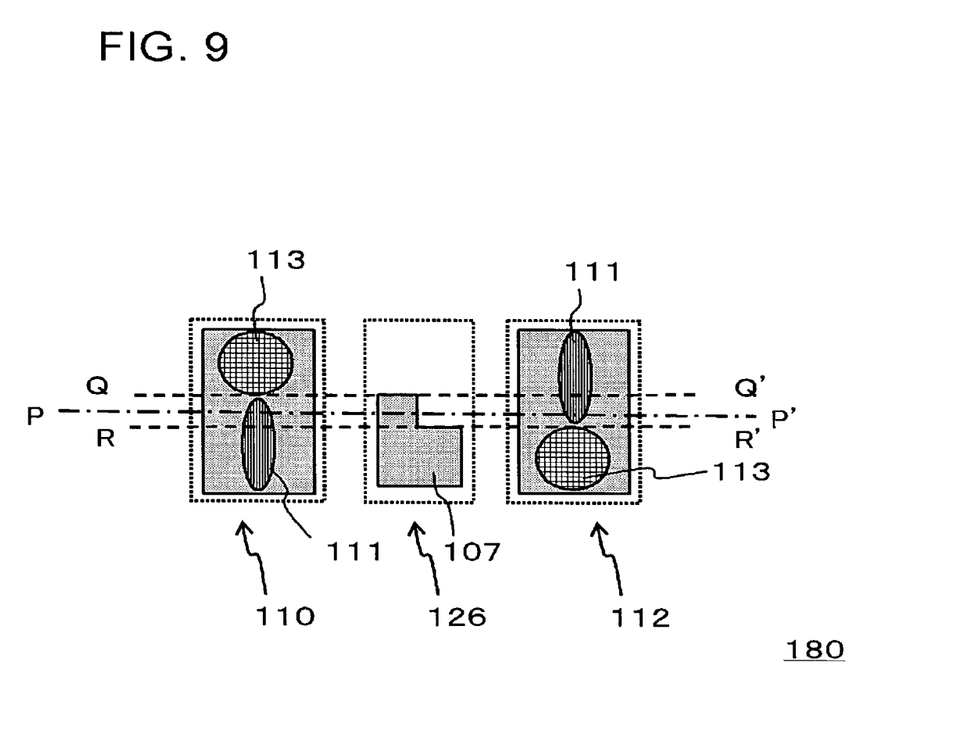

A semiconductor device 180 shown in FIG. 9 has a configuration having a planar shape where one exposed Al-layer area 107 is provided in one check mark 126 and the outer edge of the exposed Al-layer area 107 has a step, which indicates the borders Q-Q' and R-R'. Thus, the exposed Al-layer area 107 can have a further adequate area in comparison with the check mark 124 in the semiconductor device 160 shown in FIG. 7. Therefore, production stability in forming an opening in the polyimide layer 105 can be further improved.

Although the embodiments of the present invention have been described with reference to the drawings, these are just illustrative and various configurations other than those described above may be employed.

For example, although there have been described the configurations where the passivation layer formed on the bonding pad 110 and the check mark is the polyimide layer 105 in the above embodiments, the passivation layer may be, in place of an organic insulating layer such as a polyimide layer, selected from oxide layers such as an $SiO_2$ layer and nitride layers such as an SiN layer. The passivation layer may be a single layer or a multilayer in which a plurality of layers are layered. In the above embodiments, the check mark is provided separately from the bonding pad 110, resulting in higher production stability even when using such a passivation layer.

A conductive layer constituting the check mark and the bonding pad 110 may be, without being limited to an Al layer, another type of layer including a metal layer such as an Au layer and a Cu layer.

Although there has been described a configuration where part of the Al-layer forming region 108 covers the polyimide layer 105 and the contour of an opening in the polyimide layer 105 is identical to the contour of a check mark in the above embodiments, there may be used a configuration where the whole surface of the Al-layer forming region 108 is exposed and the contour of the Al-layer forming region 108 is identical to the contour of a check mark.

Although there has been mainly described a configuration where a check mark has a rectangular planar shape in the above embodiments, the shape of the check mark is not limited to a rectangle or a shape having a straight region as illustrated in FIG. 9. For example, in the semiconductor device 100 shown in FIG. 1, the check mark 120 may have an elliptical shape having a width equal to that of the probing mark 111, in which the border between the probing mark 111 forming region and the bonding region 113 is on an extension of a tangent line to the major axis of the ellipse. A check mark has a planar shape such as a rectangle or a shape having a straight region as shown in FIG. 9, so that a border can be disposed on an extension of the straight region in the contour of the check mark, resulting in a configuration where the border can be more reliably detected.

It is apparent that the present invention is not limited to the above embodiment, that may be modified and changed without departing from the scope and spirit of the invention.

What is claimed is:

1. A semiconductor device, comprising:
a bonding pad comprising a bonding region and a test-probe-contacting region within said pad; and
an area identification mark separate from said bonding pad such that it indicates a border between said bonding region and said test-probe-contacting region,
wherein said area identification mark and said bonding pad are made of a same material.

2. The semiconductor device as claimed in claim 1, wherein said border can be detected on the basis of the contour of a region occupied by said area identification mark.

3. The semiconductor device as claimed in claim 1, wherein said area identification mark has a substantially rectangular planar shape; and
one side of said rectangle indicates said border.

4. The semiconductor device as claimed in claim 1, wherein said area identification mark has a width that is the same as a width of one of said bonding region and said test-probe-contacting region.

5. The semiconductor device as claimed in claim 1, comprising a plurality of said bonding pads,
wherein said one area identification mark indicates said border in each of said plurality of bonding pads.

6. The semiconductor device as claimed in claim 5, comprising a row of said plurality of bonding pads aligned in line;
wherein at least one said area identification mark is provided for said one row, and said one area identification mark indicates said border of said bonding pad constituting said one row.

7. The semiconductor device as claimed in claim 6,
wherein said bonding regions and said test-probe-contacting regions are alternately disposed along an extension of said row; and
said one area identification marks indicates said border of said one bonding pad constituting said row and said border of another bonding pad adjacent to said one bonding pad.

8. The semiconductor device as claimed in claim 1, wherein said bonding pad and said area identification mark are formed at a same level of the semiconductor device.

9. The semiconductor device as claimed in claim 1, further comprising:
a semiconductor substrate, and
a protective layer made of an organic resin which is formed on said semiconductor substrate and has an opening in a predetermined region;
wherein a contour of said opening constitutes a contour of said area identification mark.

10. The semiconductor device as claimed in claim 9, wherein said organic resin is a polyimide.

11. The semiconductor device as claimed in claim 9, wherein said organic resin is poly-para-phenylenebenzoxazole.

12. A process for manufacturing a semiconductor device, comprising:
preparing said semiconductor device as claimed in claim 1;
detecting said border by means of said area identification mark and contacting a test probe with said test-probe-contacting region on the basis of said detected border;
bonding a conductor for external connection to said bonding region on the basis of said detected border after said contacting said test probe.

13. The semiconductor device as claimed in claim 1, wherein said area identification mark has a straight edge indicating the border and wherein said bonding pad and said area identification mark have a same width measured in a direction parallel to said straight edge.

14. A semiconductor device, comprising:
a bonding pad comprising a bonding region and a test-probe-contacting region within said pad; and
an area identification mark separate from said bonding pad such that it indicates a border between said bonding region and said test-probe-contacting region, said area identification mark having a straight edge that is collinear with the border,
wherein said bonding pad and said area identification mark are made of a same material.

* * * * *